(12) United States Patent
Robbins

(10) Patent No.: US 6,281,572 B1
(45) Date of Patent: *Aug. 28, 2001

(54) INTEGRATED CIRCUIT HEADER ASSEMBLY

(75) Inventor: William L. Robbins, Newton Center, MA (US)

(73) Assignee: The Charles Stark Draper Laboratory, Inc., Cambridge, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/986,259

(22) Filed: Dec. 5, 1997

(51) Int. Cl.[7] .................................................. H01L 23/053
(52) U.S. Cl. ............................................ 257/700; 257/698
(58) Field of Search .................................... 257/690, 729, 257/291, 293, 692, 698, 700, 730, 737; 428/64, 60, 25, 125; 357/291, 690, 642, 729

(56) References Cited

U.S. PATENT DOCUMENTS

| | | | |
|---|---|---|---|
| 4,400,870 | * 8/1983 | Islam | 29/588 |
| 5,264,726 | * 11/1993 | Yamaguchi et al. | 257/687 |
| 5,315,155 | * 5/1994 | O'Donnelly et al. | 257/711 |
| 5,717,245 | * 2/1998 | Pedder | 257/691 |
| 5,753,974 | * 5/1998 | Masukawa | 257/737 |

* cited by examiner

Primary Examiner—Olik Chaudhuri
Assistant Examiner—Douglas A. Willie
(74) Attorney, Agent, or Firm—McDermott, Will & Emery

(57) ABSTRACT

An integrated circuit (IC) header subassembly includes a spacer mounted to the header. The IC die assembly, consisting of an IC die or IC die carrier assembly, is mounted to spacer which is mounted to the header. The coefficient of thermal expansion of the spacer is selected to be between the coefficient of thermal expansion of the IC die assembly and the header minimize stresses due to thermal expansion and contraction. In addition, the spacer is substantially smaller in width and length and the IC die assembly and the header whereby the IC die assembly appears to be pedestal mounted. By minimizing the length of the contacting surfaces between the spacer and the IC die assembly, the risk of warping or cracking due to differences in thermal expansion can be reduced. This allows for much larger IC dies and pixel arrays to be used.

18 Claims, 3 Drawing Sheets

INTEGRATED CIRCUIT HEADER ASSEMBLY

CROSS-REFERENCE TO RELATED APPLICATIONS

This application is related to commonly owned U.S. Ser. No. 08/985,807 now U.S. Pat. No. 6,020,646 entitled Integrated Circuit Die Assembly, by John Boyle and William Robbins.

STATEMENT REGARDING FEDERALLY SPONSORED RESEARCH

Not Applicable

REFERENCE TO MICROFICHE APPENDIX

Not Applicable

BACKGROUND OF THE INVENTION

This invention relates to integrated circuit header assemblies and, more particularly, to an assembly comprising an integrated circuit (IC) die mounted to a header assembly and method for making the same. The integrated circuit header assembly used in electron bombarded charged coupled devices (EBCCDs) provides improved control of the spacing between the die and the cathode and accommodates combinations of materials having different coefficients of thermal expansion.

Integrated circuit devices are typically fabricated from semiconductor or silicon dies that are mounted in modules that can include supporting carriers or substrates and headers. In applications where the IC die is fragile or subject to further processing, the IC die can be mounted to a substrate or carrier to provide further support or facilitate further processing. Typically, the IC die carrier (or substrate) assemblies are subsequently mounted to a header which includes pins or other leads which allow the device to be electrically and mechanically connected to the system in which is used. The header can facilitate mounting the IC module to a circuit board, a mating socket or module housing or enclosure. Typically, fine gold wires are bonded to conductive pads on the die or the carrier and the header to establish electrical connections between the pins or leads of the header and the integrated circuit on the die.

In EBCCDs, the spacing between the IC die and the cathode determines the acceleration voltage required. In prior art devices, the header includes an integral pedestal that fixed the amount of reentrance (the distance between the IC die and the cathode) at the time of the header was fabricated. This required a different header for each different type of EBCCD tube. In addition, because the header is constructed from materials which match the thermal expansion coefficient of the side walls of EBCCD tube, it is not a good thermal expansion match for the silicon IC die. The stresses caused by the thermal expansion mismatch can cause the EBCCD die to warp or crack.

Accordingly, it is an object of this invention to provide an improved integrated circuit device.

It is another object of the invention to provide an improved header subassembly device for supporting an IC die.

It is yet another object of the invention to provide an improved integrated circuit device that is suitable for processing and use in higher temperature environments.

It is a further object of the invention to provide an improved circuit device comprising an integrated circuit die mounted to a header wherein thermal coefficients of expansion of the components are selected to reduce the stress associated with thermal expansion of different materials having different expansion coefficients.

It is a further object of the invention to provide an improved method of mounting an integrated circuit device to a header.

It is a further object of the invention to provide an improved method of mounting a electron bombarded charged coupled device to a header.

SUMMARY OF THE INVENTION

The present invention is directed to integrated circuit devices or modules such as those composed of integrated circuit dies and header subassemblies. As used herein, the term IC die assembly is intended to include IC dies that can be directly mounted to a header as well as IC dies that are mounted to carriers or substrates wherein the IC die carrier assembly is mounted to the header. In accordance with the invention, the integrated circuit device includes an IC die assembly which has conductive pads for establishing connections with the integrated circuit contained therein and a header to which the IC die assembly is mounted. The header also includes conductive pads connected to pins or leads to facilitate electrical connections with the IC. In order to effect electrical connections between the conductive pads on the IC die assembly and conductive pads on the header, one or more conducting elements can be used. In order to effect mechanical attachment of the IC die assembly to the header, a spacer is provided between the die and carrier. Where the IC die assembly is an EBCCD die carrier assembly, the height or thickness of the spacer can be used to control or vary the reentrance characteristic (distance between the EBCCD die and the cathode) of the EBCCD tube. The spacer can be constructed of a material that is has a coefficient of thermal expansion between the coefficient of thermal expansion of the IC die assembly and the header to provide operation over a broader range of temperatures. In addition, the width and length of the spacer are substantially smaller than that of the IC die assembly such that IC die is substantially pedestal mounted thereby minimizing the length of the contacting surfaces between the spacer and the IC die assembly and minimizing the risk of warping or cracking due to differences in thermal expansion. This allows EBCCD tubes and other IC devices with much larger IC dies and pixel arrays to be fabricated.

The process of fabricating the IC device can include the steps of: A) attaching the spacer to the header via a metal or glass reflow material; B) applying a layer of mounting material, preferably glass frit, to the first side of the spacer; C) fixturing the IC die assembly in position on the spacer and D) under controlled temperature conditions, applying pressure to the join the IC die assembly and the spacer on the header.

In step A, the spacer can be attached to the header by applying a layer of metal reflow material on mating surfaces of the spacer and the header and under controlled temperature conditions applying pressure to join the spacer to the header. Alternatively, a layer of glass reflow material can be applied to either the header or the spacer and under controlled temperature conditions, applying pressure to join the IC die assembly to the header.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

The present invention is directed to an electronic integrated circuit module that is suitable for use in ultrahigh vacuum and high temperature environments. Typically, the IC is embodied in an IC die which is formed on a wafer containing one or more IC dies. Each IC die is separated from the wafer and assembled in a module that facilitates mounting the module to a device such as a printed circuit board, a component housing or vacuum tube. The module typically includes a header which provides a plurality of pins or leads that facilitate electrical (and sometimes mechanical) connection of the IC in the module to the circuit and/or housing.

In the preferred embodiment, the IC die is an EBCCD die which is configured for backside illumination. This type of EBCCD die must be backside thinned to approximately 10 to 20 microns. Preferably, the unthinned EBCCD die is mounted to a carrier or substrate which provides mechanical support during and after the thinning process such as disclosed in commonly owned U.S. patent application Ser. No. 08/985,807 by J. Boyle and W. Robbins, entitled "Integrated Circuit Die Assembly," which is hereby incorporated by reference in its entirety. Preferably, the EBCCD die includes an array of charge coupled devices (CCD sensors or pixels) that are effective for photon or electron activation. In accordance with the invention, arrays of up to 1000 by 1000 pixels and larger may be fabricated according to the method and device of the present invention.

Figure 1:
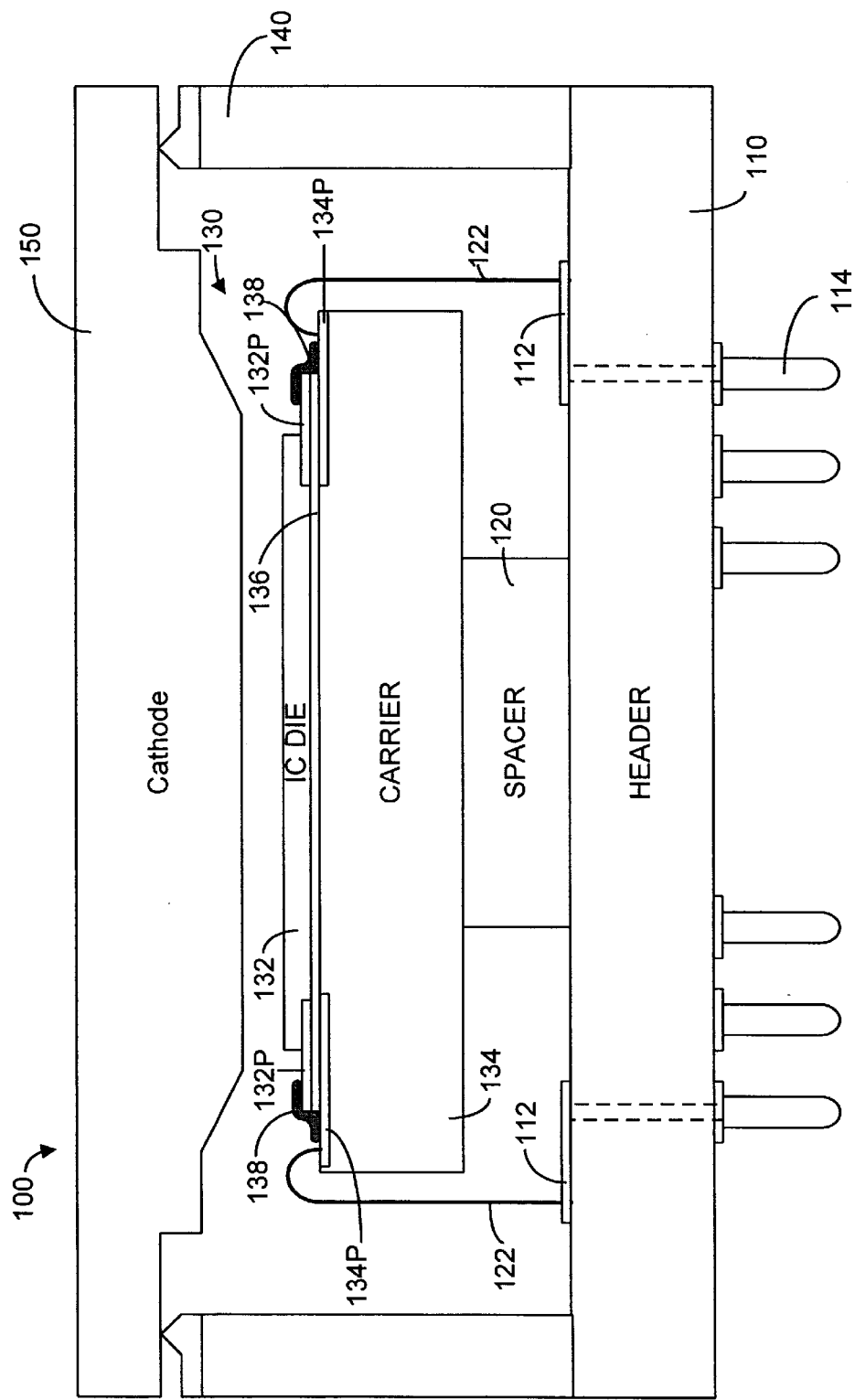
FIG. 1 is a diagrammatic view of an EBCCD tube including a header subassembly according to the present invention.

FIG. 1 shows an EBCCD tube 100 in accordance with the present invention. The EBCCD tube 100 includes a CCD array die carrier assembly 130 which is composed of a layer of glass 136 adhering the thinned EBCCD die 132 to the carrier 134. The front side of the thinned CCD die 132 includes conductive pads 132P which are electrically connected to the CCD array. The carrier 134 also includes conductive pads 134P which can be electrically connected to the conductive pads 132P of the CCD die by any known method. Preferably, the electrical connection is provided by the application of a thin or thick film of conductive material 138. Preferably, the conductive material 138 is a metal material such as aluminum although a conductive ceramic material such as titanium nitride can also be used. Alternatively, wire bonds can be used to electrically connect the pads 132P of the CCD die 132 to the pads 134P of the carrier 134.

The CCD die carrier assembly 130 is mounted to the header 110 by the spacer 120. Wire bonds 122 connect the pads 134P of the carrier 134 to the pads 112 of the header 110 which are connected to pins or leads 114 which facilitate electrical and mechanical connection of the EBCCD IC in the tube 100 to a circuit via a socket (not shown). The side walls 140 and the cathode 150 enclose the EBCCD die in a chamber C that is evacuated to ultrahigh levels, preferably as high as $10^{-11}$ torr. The reentrance or the distance between EBCCD die 132 and the cathode 150 determines the acceleration voltage or potential needed to accelerate electrons toward the EBCCD die 132 to achieve the desired level of performance.

The header subassembly is composed of the header 110 and the spacer 120. The size and thickness of the header 110 are selected to accommodate the pin 114 array need to access the array of CCD pixels in the EBCCD die. In the preferred embodiment, the header formed of 0.100 inches thick black alumina (aluminum oxide) that is round, approximately 1.0 inch in diameter and includes a pin grid array (PGA) having 37 pins. Preferably, the spacer 120 is formed from a material having a coefficient of thermal expansion that is between the coefficient of thermal expansion of the EBCCD die carrier assembly 130 and the header 110, such as aluminum nitride, INVAR 36 (a composite material available from Carpenter Technology, Inc. of Reading, Pa.) or Alloy 39 (a composite material available from Scientific Alloys, Inc. of Westerly, R.I. In the preferred embodiment, the spacer 120 is approximately 0.400 inches in width by 0.400 inches in length which is substantially smaller than both the EBCCD die carrier assembly 130 (which is approximately 0.650 by 0.550 inches) and the header 110. The width and length of the spacer 120 are selected to be sufficiently small relative to the width and length of the IC die carrier assembly 130 such that over the maximum operating temperature range of the device, the stresses generated due to thermal expansion will not substantially effect the expected performance of the device.

Preferably, the bottom surface of the spacer 120 is fastened to the header 110 using a gold tin (80-20) eutectic alloy reflow. The top surface of the spacer is fastened to the IC die carrier assembly 130 by a layer of reflowed glass, such as the same material used to fasten the EBCCD die 132 to the carrier 134. Preferably, the glass is Ferro 2760 glass frit available from Ferro Corp. of Cleveland, Ohio and is less than 0.001 inches thick. After the IC die carrier assembly 130 is fastened to the spacer 120, wire bonds 122 are applied to connect the conductive pads 134P of the carrier 134 to the conductive pads 112 of the header 110. The side walls 140 can also be fastened to header 110 via a layer of reflowed glass. The entire assembly is placed in an evacuated chamber wherein the cathode 150 is positioned on top of the side walls 140 and entire device is sealed in a potted tube (not shown).

Figure 2:
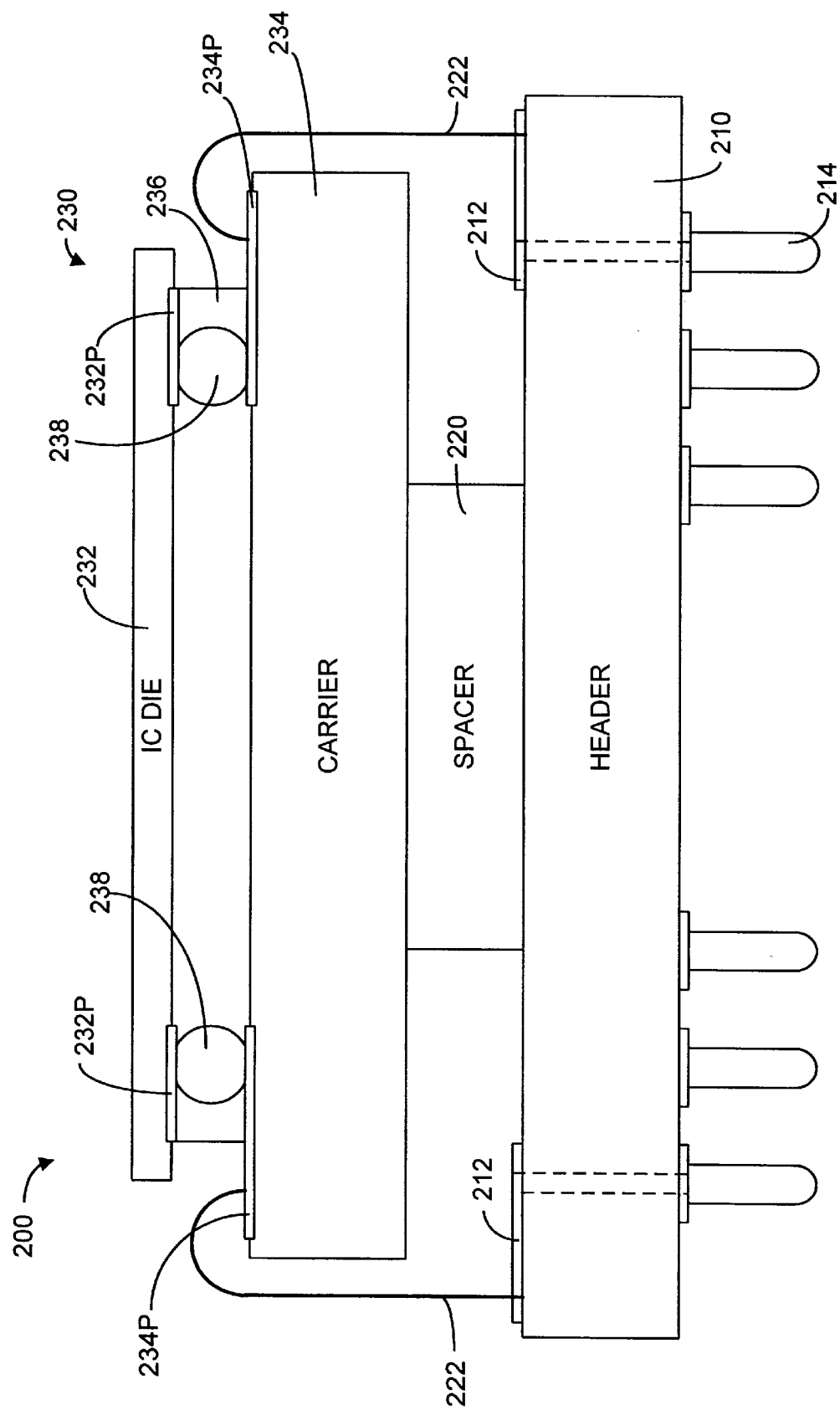
FIG. 2 is a diagrammatic view of a circuit device according to the present invention.

FIG. 2 shows an alternate embodiment of an EBCCD module 200. This embodiment is similar to the embodiment shown in FIG. 1 except that the EBCCD die assembly 230 is formed from an EBCCD die 232 that is mounted to a carrier 234 via a thin layer of glass 236 which uses ball bonds 238 to electrically connect the conductive pads 232P on the front side of the EBCCD die 232 to the conductive pads 234P on the carrier 236. This embodiment provides certain advantages over that shown in FIG. 1. In this embodiment, the EBCCD die 232 requires less processing because the die does not have to etched or lapped to be expose the pads. However, in the present embodiment, the layer of glass 236 has to be thicker than the layer of glass 136 in the embodiment of FIG. 1 in order to accommodate the ball bonds 238.

In a manner similar to the embodiment of FIG. 1, the header subassembly is constructed from the header 210 and the spacer 220. Similarly, the header 210 is formed from an approximately 1.0 inch diameter round multi-layer Alumina (aluminum oxide) material approximately 0.100 inches thick overall and 0.030 to 0.040 inches thick at the die cavity. Preferably, the header 210 includes a PGA having 37 pins on the bottom which are electrically connected to conductive pads 212 located on the peripheral portion of the top surface. The spacer 220 is formed from a material having a coefficient of thermal expansion that is between the coefficient of thermal expansion of the EBCCD die assembly 230 and the coefficient of thermal expansion of the header. Preferably, where the carrier 234 is formed from a silicon or PYREX material, the spacer 220 is formed from an aluminum nitride, INVAR 36 or ALLOY 39 material which is much smaller in width and length than the carrier. As described above, the size of the spacer 220 is determined by the maximum temperature range that the device will be exposed to and the construction of the carrier 234 and the header 210 to minimized stress and reduce the likelihood of failure due to thermal expansion differences. In this embodiment, the height or thickness of the spacer 220 can be slightly less than that of the embodiment of FIG. 1 because EBCCD die is positioned higher above the carrier 234 due to the greater thickness of the glass layer 236. The spacer 220 can be fastened to the header 210 via a metallic reflow (such as a gold tin eutectic solder) and the spacer 220 can be fastened to the carrier 234 via a reflowed layer of glass as discussed above.

Figure 3:
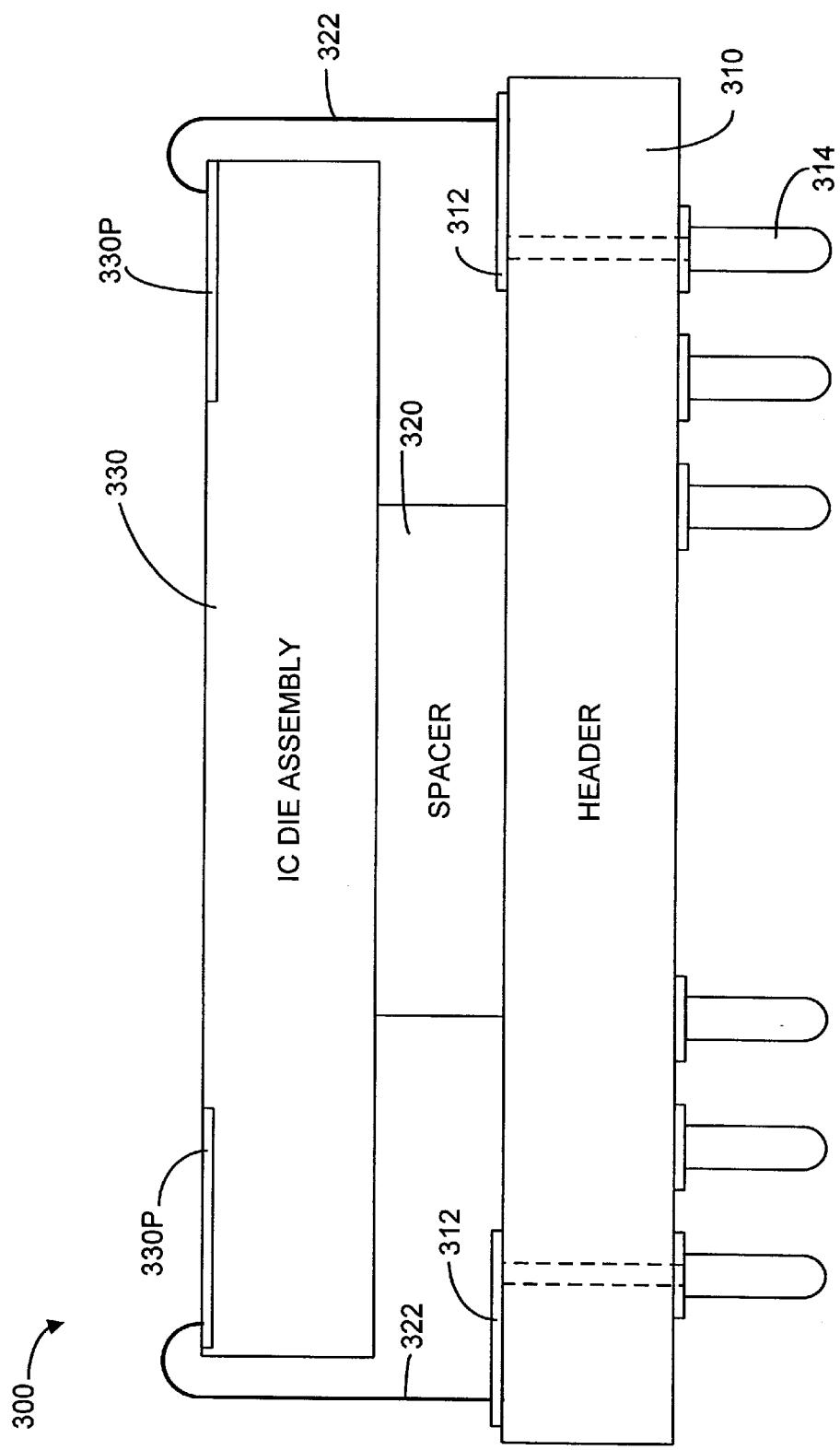
FIG. 3 is a diagrammatic view of an alternate circuit device according to the present invention.

FIG. 3 shows an alternative embodiment of the present invention wherein the IC die assembly 330 is an IC die that is not mounted to a carrier and can be directly supported by the spacer 320. This embodiment may be used for example for mounting a front side illuminated CCD die. In this embodiment, the header 310 and the spacer 320 can be constructed from the same materials and via the same methods as the embodiments of FIGS. 1 and 2 above. Preferably, the spacer 320 is formed from a material having a coefficient of thermal expansion that is between the coefficient of thermal expansion of the IC die assembly 330 and the coefficient of thermal expansion of the header 310. In addition, the width and length of the spacer 320 is substantially smaller than the width and length of the IC die assembly 330 and the thickness of the spacer 320 is determined as necessary to position the CCD die for illumination. It will be appreciated that CCD dies of 1.0 inch by 1.0 inch and larger can be accommodated by header subassembly of the present invention.

The header subassembly is fabricated by first forming a header having a predefined shape and PGA configuration. The material is preferably a cofired black alumina. The spacer is formed from a material having a coefficient of thermal expansion between that of the header and that of the IC die or IC die carrier assembly. The thickness or height of the spacer is specified as a function of the desired position of the IC die. In the case where the IC die is an EBCCD, the thickness of the spacer is specified as a function of the desired reentrance or acceleration potential of the resulting device.

Preferably, the spacer is attached to the header and IC die or IC die carrier assembly is subsequently attached to spacer. The spacer is attached to the header by applying a layer of a metallic reflow material such as a gold tin eutectic alloy to either or both of the spacer and header surfaces to be joined. The spacer is positioned, under pressure, on the header and gold tin alloy is reflowed to firmly bond the spacer to the header.

The IC die or IC die carrier assembly is attached to the spacer by applying a layer of a glass material to either or both of the IC die or IC die carrier assembly and spacer surfaces to be joined. Preferably, the glass is a glass frit such as the Ferro type 2760 described above. The IC die or IC die carrier assembly is positioned, under pressure, on the spacer and glass material is heated until it reflows and joins the IC die or IC die carrier assembly to the spacer. Preferably, the glass is sintered to near full sintered density. In addition, special fixturing may be provided to insure that the IC die or IC die carrier assembly is correctly positioned at the desired height and orientation relative to the header.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are therefore intended to be embraced therein.

What is claimed is:

1. A circuit device comprising:
   A. an integrated circuit die assembly having a first surface including a plurality of peripherally disposed conductive regions and a second surface having a first dimension and a second dimension mutually orthogonal to said first dimension;
   B. a header having a header first surface including a plurality of peripherally disposed electrical pads;
   C. an electrically non-conductive spacer free of electrical paths formed therein or directly coupled thereto, said spacer having a spacer first surface coupled to said second surface of said integrated circuit die assembly and having a spacer second surface coupled to said header first surface, wherein said coupling of said spacer second surface and said header first surface is free of intervening electrical contacts, wherein said spacer maintains said integrated circuit die assembly in spaced relation to said header, and wherein said spacer first surface has a first dimension and a second dimension mutually orthogonal to said first dimension, wherein said first dimension of said spacer is less than said first dimension of said integrated circuit die assembly and said second dimension of said spacer is less than said second dimension of said integrated circuit die assembly; and
   D. conducting means for electrically connecting said conductive regions of said integrated circuit die assembly to said electrical pads of said header.

2. A circuit device according to claim 1 wherein said integrated circuit die assembly has a coefficient of thermal expansion and said header has a coefficient of thermal expansion and said spacer has a coefficient of thermal expansion between the coefficient of thermal expansion of said integrated circuit die assembly and the coefficient of thermal expansion of said header.

3. A circuit device according to claim 1 wherein said first dimension of said spacer is no more than 75% of said first dimension of said integrated circuit die assembly and said second dimension of said spacer is no more than 75% of said second dimension of said integrated circuit die assembly.

4. A circuit device according to claim 1 wherein said conducting means includes wire bonds connecting the conductive regions of the integrated circuit die assembly with the conductive pads of the header.

5. A circuit device according to claim 1 wherein said integrated circuit die assembly includes:
   1) an integrated circuit die including a plurality of conductive integrated circuit die pads, said integrated circuit die having a first side and a second side, and 2) a carrier having a carrier first side coupled to said second side of said integrated circuit die, wherein said carrier first side includes said integrated circuit die assembly conductive regions, and a carrier second side comprising said integrated circuit die assembly second surface, wherein said conducting means includes:

3) a thin film of a metallic material applied between said integrated circuit die pads and said conductive regions of the integrated circuit die assembly.

6. A circuit device according to claim 1 wherein said spacer is fastened to said header via a first fastening means.

7. A circuit device according to claim 6 wherein said first fastening means comprises a metal reflow material.

8. A circuit device according to claim 7 wherein said first fastening means comprises a gold tin alloy material.

9. A circuit device according to claim 1 wherein said integrated circuit die assembly is fastened to said spacer via a second fastening means.

10. A circuit device according to claim 9 wherein said second fastening means comprises a glass material.

11. A circuit device according to claim 1 wherein said integrated circuit die assembly is a charged coupled device (CCD).

12. A circuit device according to claim 11 wherein said integrated circuit die assembly is a backside illumination CCD.

13. A circuit device comprising:

A. a charge coupled device (CCD) having a first surface including a plurality of peripherally disposed electrically conductive regions and a second surface having a first dimension and a second dimension mutually orthogonal to said first dimension;

B. a header having a header first surface including a plurality of peripherally disposed electrically conductive pads coupled to electrical contacts on a header second surface;

C. an electrically non-conductive spacer free of electrical paths formed therein or directly coupled thereto, said spacer having a first surface coupled to said second surface of said CCD assembly and having a spacer second surface coupled to said header first surface, wherein said coupling of said spacer second surface and said header first surface is free of intervening electrical contacts, wherein said spacer maintains said CCD assembly in a spaced relation to said header, and wherein said spacer first surface has a first dimension and a second dimension mutually orthogonal to said first dimension, wherein said first dimension of said spacer is less than said first dimension of said CCD assembly and said second dimension of said spacer is less than said second dimension of said CCD assembly; and D. conducting means for electrically connecting at least one of said conductive regions of said CCD assembly to at least one of said conductive pads of said header.

14. A circuit device according to claim 13 wherein said CCD assembly has a coefficient of thermal expansion and said header has a coefficient of thermal expansion and said spacer has a coefficient of thermal expansion between the coefficient of thermal expansion of said CCD assembly and the coefficient of thermal expansion of said header.

15. A circuit device according to claim 13 wherein said first dimension of said spacer is no more than 75% of said first dimension of said CCD assembly and said second dimension of said spacer is no more than 75% of said second dimension of said CCD assembly.

16. A circuit device according to claim 13 wherein said conducting means includes wire bonds connecting the conductive regions of the CCD assembly with the conductive pads of the header.

17. A circuit device according to claim 13 wherein said spacer is fastened to said header via a metal reflow material.

18. A circuit device according to claim 13 wherein said integrated circuit die assembly is fastened to said spacer via a glass material.

* * * * *